(12) United States Patent
Shimano et al.

(10) Patent No.: US 6,418,075 B2
(45) Date of Patent: Jul. 9, 2002

(54) SEMICONDUCTOR MERGED LOGIC AND MEMORY CAPABLE OF PREVENTING AN INCREASE IN AN ABNORMAL CURRENT DURING POWER-UP

(75) Inventors: Hiroki Shimano; Kazutami Arimoto; Yasuhiro Ishizuka; Seizou Furubeppu; Hiroki Sugano, all of Tokyo (JP)

(73) Assignees: Mitsubishi Denki Kabushiki Kaisha; Mitsubishi Electric Engineering Company Limited, both of Tokyo (JP)

( * ) Notice: Subject to any disclaimer, the term of this patent is extended or adjusted under 35 U.S.C. 154(b) by 0 days.

(21) Appl. No.: 09/759,315

(22) Filed: Jan. 16, 2001

(30) Foreign Application Priority Data

Jul. 21, 2000 (JP) .................................. 2000-221394

(51) Int. Cl.[7] ................................................ G11C 5/14
(52) U.S. Cl. ........................ 365/227; 365/229; 365/226; 365/189.09; 365/189.11; 327/534; 327/537; 327/535; 327/541; 327/543
(58) Field of Search ................................. 365/227, 226, 365/229, 189.09, 189.11; 327/537, 535, 534, 541, 543, 538

(56) References Cited

U.S. PATENT DOCUMENTS 5,289,425 A * 2/1994 Horiguchi et al. .......... 365/226
5,347,492 A * 9/1994 Horiguchi et al. .......... 365/226
5,448,526 A * 9/1995 Horiguchi et al. .......... 365/226
5,627,493 A * 5/1997 Takeuchi et al. ............ 327/546
6,205,079 B1 * 3/2001 Namekawa .................. 365/226

FOREIGN PATENT DOCUMENTS

| JP | 7-231252 | 8/1995 | ....... H03K/19/0185 |
| JP | 9-98083 | 4/1997 | ....... H03K/19/0185 |

* cited by examiner

*Primary Examiner*—Andrew Q. Tran
(74) *Attorney, Agent, or Firm*—Burns, Doane, Swecker & Mathis, LLP

(57) ABSTRACT

A semiconductor integrated circuit in which a logic and a memory are merged, includes a voltage generation unit for generating two or more internal power supply voltages based on two or more external power supply voltages supplied from outside the voltage generation unit with different timings and for furnishing the plurality of internal power supply voltages to the memory. The voltage generation unit includes a standby unit with a small current-feed ability that is always activated, for generating the plurality of internal power supply voltages, and an active unit with a large current-feed ability that is activated as needed, for generating the plurality of internal power supply voltages. An activation control unit prevents the active unit from being activated until all of the plurality of external power supply voltages rise.

9 Claims, 13 Drawing Sheets

SEMICONDUCTOR MERGED LOGIC AND MEMORY CAPABLE OF PREVENTING AN INCREASE IN AN ABNORMAL CURRENT DURING POWER-UP

BACKGROUND OF THE INVENTION

1. Field of the Invention

The present invention relates to a semiconductor integrated circuit including a logic and a memory merged therein, and a function of preventing increase in an abnormal electric current on power-up. Particularly, it relates to prevention of the abnormal electric current in a semiconductor integrated circuit of two external power supply scheme.

2. Description of the Prior Art

In a system LSI in which a DRAM and a logic, such as a processor or an ASIC (application specific IC), are merged, by connecting between the DRAM and the logic by using a multiple-bit, such as 128-bit, ..., or 512-bit, internal data bus, it is possible to achieve a high data rate transmission speed which is about one or two orders of magnitude faster compared with a case to connect them with each other on a printed board. Furthermore, it is possible to reduce the number of pins of external I/O compared with a system configuration including a general-purpose DRAM located outside, and to decrease the parasitic impedance of the I/O line by one order or more. Therefore, such a system LSI can greatly reduce current, and contribute to enhancing of the performance of information processing equipment that processes a large amount of data, such as 3D graphic processing equipment or image and speech processing equipment.

FIG. 18 is a block diagram showing the structure of a general system LSI including a logic and a DRAM merged therein. In the figure, reference numeral 1 denotes a large-scale logic, and numeral 2 denotes external pins of this large-scale logic 1. Reference numeral 3 denotes an analog core that processes an analog signal, and numeral 4 denotes analog pins of this analog core 3. Reference numeral 5 denotes a DRAM core connected with the large-scale logic 1 via internal interconnections, for storing data which are needed by the large-scale logic 1, numeral 6 denotes a test interface circuit (hereafter abbreviated as TIC) that disconnects the large-scale logic 1 from the DRAM core 5 in test mode, numeral 7-1 denotes test pins that are connected with the DRAM core 5 by the TIC 6 in test mode, and numeral 7-2 denotes a power supply pin via which an external power supply voltage exVDD is supplied to the DRAM core 5.

In operation, the large-scale logic 1 executes an instructed processing based on an instruction input via the external pins 2, and outputs the execution result via the external pins 2. The analog core 3 is connected between the large-scale logic 1 and the analog pins 4, and performs a processing on analog signals. The processing performed by the analog core 3 includes generation of an internal clock signal using a phase-locked loop (PLL), conversion of an analog signal from outside the chip into an equivalent digital signal using an analog-to-digital converter, conversion of a digital signal from the large-scale logic 1 into an equivalent analog signal using a DAC, etc. The TIC 6 disconnects the large-scale logic 1 from the DRAM core 5, and connects the test pins 7-1 with the DRAM core 5 when the chip is placed in test mode. In test mode, a test is carried out on the DRAM core 5 with a tester connected by way of the test pins 7-1 to the chip.

FIG. 14 is a block diagram showing the structure of the DRAM disposed in the prior art semiconductor integrated circuit. In the figure, reference numeral 8 denotes a central control circuit block, numeral 9 denotes a command decoder/control circuit, numeral 10 denotes a row address input buffer/latch/refreshing counter, numeral 11 denotes a row pre-decoder, numeral 12 denotes a column address input buffer/latch, numeral 13 denotes a column pre-decoder, numeral 14 denotes a data I/O controller, numeral 15 denotes an internal power supply voltage generation circuit/self-refresh timer block, numeral 16 denotes a memory array, numeral 17 denotes a sense amplifier band, numeral 18 denotes a row/column local control band, and numeral 19 denotes a data path band.

The central control circuit block 8 latches various external control signals given from outside the block in synchronization with a clock signal CLK, decodes them, and activates two or more internal control signals in response to an internal command specified by the decoded external control signals. The internal power supply voltage generation circuit of the internal power supply voltage generation circuit/self-refresh timer block 15 generates a boosted voltage VPP, a power supply voltage VCCP for peripheral circuits, an array power supply voltage VCCS, a precharge voltage VBL, a cell plate voltage VCP, and a substrate voltage VBB.

FIG. 19 is a block diagram showing the structure of such a prior art internal power supply voltage generation circuit. In the figure, reference numeral 20 denotes a level shifter, numeral 21 denotes a VBB generation circuit, numeral 22 denotes a reference voltage generation circuit, numeral 23 denotes a VCCS generation circuit (hereafter abbreviated as VDCS), numeral 24 denotes a VBL/VCP generation circuit, numeral 25 denotes a VPP generation circuit, and numeral 26 denotes a VCCP generation circuit (hereafter abbreviated as VDCP). Each of the VBB generation circuit 21, the VDCS 23, the VPP generation circuit 25, and the VDCP 26 has an active circuit with a large current-feed ability and a standby circuit with a small current-feed ability in parallel.

In the internal power supply voltage generation circuit, to maintain the voltage levels of the plurality of internal power supplies during the standby period of the DRAM, the standby circuits of the VBB generation circuit 21, the VDCS 23, the VPP generation circuit 25, and the VDCP 26 are always activated.

When the decoded control signals associated with an internal command issued indicate row activation, the active circuits of the VBB generation circuit 21, the VDCS 23, the VPP generation circuit 25, and the VDCP 26 are activated according to an ACTOR signal issued by the command decoder/control circuit 9.

The VDCS 23 is provided with a VCCS abnormality detector for always monitoring the array power supply voltage VCCS, and when the voltage decreases abnormally, raises its output signal from a "Low" level to a "High" level. Furthermore, the VDCP 26 is provided with a VCCP abnormality detector for always monitoring the power supply voltage VCCP, and when the voltage decreases abnormally, raises its output signal from a "Low" level to a "High" level. Similarly, the VPP generation circuit 25 is provided with a VPP abnormality detector for always monitoring the boosted voltage VPP, and when the voltage decreases abnormally, raises its output signal from a "Low" level to a "High" level. As a result, the active circuits of the VDCS 23, the VPP generation circuit 25, and the VDCP 26 are activated respectively. When the voltage of one above-mentioned internal power supply generated decreases abnormally even during the standby period, a corresponding active circuit within the VDCS 23, the VPP generation circuit 25, or the VDCP 26 receives the output signal of a corresponding abnormality detector, and is then activated. Thus, the internal power supply voltage generation circuit can thus recover the abnormally-decreased voltage of an internal power supply to its normal value by activating a corresponding active circuit.

As shown in FIG. 15, the memory array 16 is divided into a number of submemory arrays (SMA) 27. Two subword driver bands (SWD) 28 and two sense amplifier bands (S/A) 29 are arranged around each of the plurality of submemory arrays 27. A plurality of main word lines 30 are arranged in a series of two or more submemory arrays 27 arranged in a row so that they extend in the row and are across the two or more submemory arrays 27. Two or more subword lines 32 are connected with each main word line 30 by way of subword drivers 31. Each main word line 30 is driven by a main word driver (MWD) 34 that operates from a signal from a row decoder (RD) 33.

Furthermore, the row/column local control band 18 consists of a row decoder 33, a column decoder (not shown in the figure), a main word driver 34, and a row local control circuit 35 containing a sense amplifier drive signal generation circuit and a subdecode signal generation circuit. FIGS. 16(a) to 16(c) are diagrams showing the structure of the row/column local control band 18. The column decoder is omitted in this figure.

As shown in FIG. 16(a), the row decoder (RD) 33 includes a circuit for generating a selection signal to select a main word line from a block decode signal BS, pre-decode signals 1 to 3, and a timing control signal RXT, and a circuit for generating a selection signal to select a subdecode line from the block decode signal BS, a pre-decode signal 0, and a timing control signal RXACT. The main word driver 34 includes a circuit for driving a main word line (MWL) having an amplitude at the VPP level in response to the selection signal to select the main word line, which is generated by the row decoder 33.

The row local control circuit 35 includes a circuit for driving a subdecode line (ZSDF) in response to the selection signal to select the subdecode line, which is generated by the row decoder 33, a circuit for generating a ZRST signal to return both the main word line and the subdecode line to the VPP level when the assertion of the decoded control signals is reset, and a circuit for generating a group of sense amplifier control signals, a shared gate signal BLI, a bit line precharge signal BLEQ, and sense activation signals S0N and ZS0N. The level shifter shown in FIG. 16(b) or 16(c) generates the ZRST signal with an amplitude at either the VPP level or the exVDD level, BLI signal, BLEQ signal, and the S0N signal of the above-mentioned sense amplifier control signals from the block decode signal BS at the VCCP level and the control signal RXACT signal.

FIG. 17 shows the connection between each submemory array 27 in FIG. 15 and both a subword driver band 28 and a sense amplifier band 29 arranged around each submemory array 27. Each submemory array 27 includes a plurality of memory cells (not shown in the figure) arranged in the form of an array, and the gates of a plurality of memory cells arranged in the same row is connected with an identical subword line 32. The subword line 32 is connected with each subword driver 31 located in one subword driver band 28 surrounding each submemory array 27. A plurality of memory cells arranged in the same column are connected with either a pair of bit lines BLL and ZBLL or another pair of bit lines BLR and ZBLR. Each of these two bit line pairs is connected with a sense transistor by way of a bit line separation transistor having a gate to which a shared gate signal BLIL or BLIR is input. A pair of bit line equalize/precharge transistors can be arranged on the sense transistor side, i.e., inside the pair of bit line separation transistors in the sense amplifier 36, not outside the pair of bit line separation transistors as shown in FIG. 17.

Each main word line 30 and each subdecode line (ZSDF) 40 are both maintained at the VPP level in the state of non-selection. The levels of a main word line 30 and a subdecode line 40 selected fall from the VPP level to a "Low" level when the decoded control signals associated with an internal command issued indicate row activation. In the subword driver 31 arranged in the intersection shown in FIG. 17, a signal SD from the subdecode driver 37 connected with the selected subdecode line 40 changes from the "Low" level to the VPP level, and a signal ZSD changes from the VCCS level to the "Low" level. The subword driver 31 raises the level of the subword line 32 selected by a main word line 30 and a subdecode line 40 from a "Low" level to the VPP level in response to these signal changes. When the assertion of the decoded control signals is reset by an internal precharge command or the like for the DRAM to return to the standby state, the main word line 30 and the subdecode line 40 which have been selected return to the VPP level again, and the level of the subword line 32 falls from the VPP level to the "Low" level.

The pair of bit line separation transistors is maintained at the VPP level before the corresponding subword line 32 rises. Furthermore, since the two bit line precharge signals BLEQL and BLEQR are at a "High" level, the pair of bit line equalize/precharge transistors maintains the two bit line pairs at the bit line precharge voltage level VBL, respectively. The gate levels of one of the pair of bit line separation transistors and a corresponding one of the pair of bit line equalize/precharge transistors fall to the "Low" level immediately before the subword line 32 rises. Thus, when the pair of bit lines BLL and ZBLL enters a floating state while it is held at the bit line precharge voltage level VBL, and a corresponding subword line 32, rises, the storage node of the selected memory cell is connected with one of the bit line pair, and the electric charge on the capacitor in the memory cell is readout to the bit line pair. By making the sense activation signal S0N become a "High" level and making the ZS0N signal become a "Low" level when the electric charge of the memory cell is completely read out to the bit line pair, the sense drive circuit 38 arranged in the intersection of FIG. 17 is made to operate, and all sense transistors on the corresponding sense amplifier band 29 are activated together by the output signals S2P and S2N of the sense drive circuit 38.

General-purpose DRAMs are so structured as to generate all internal power supply voltages VPP, VCCS, VCCP, VBL, VCP, and VBB from one 3.3V external power supply exVDD for example. FIG. 20 schematically shows the rises of main ones of those internal power supply voltages generated when turning on one external power supply exVDD for such a general-purpose DRAM. In the internal power supply voltage generation circuit/self-refresh timer block 15 shown in FIG. 19, a power-on reset signal POR not shown in the figure rises as the external power supply exVDD rises. As a result, each circuit of the internal power supply voltage generation circuit unit starts operating, and the output of each circuit reaches a desired voltage after the expiration of a fixed time interval. As a result, the chip becomes a standby state.

When a DRAM merged with a logic in one chip uses one external power supply, a sequence for turning on a power supply that is the same as that for general-purpose DRAMs is executed and all main word lines (MWL), all subdecode lines (ZSDF), and the BLI signal remain at the VPP level in the row/column local control band 18 shown in FIG. 16. In addition, the BLEQ signal remains at the exVDD level, the S0N signal remains at a "Low" level, and the ZS0P signal remains at the VCCP level, so that the DRAM is held in a standby state.

However, in a system LSI with a built-in DRAM shown in FIG. 18, the large-scale logic 1 can operate from a lower logic voltage VLOGIC than the external power supply exVDD supplied to the DRAM core 5 for power consumption decrease. When the power supply voltage VCCP supplied to the DRAM core 5 can be set to be the same as the logic voltage VLOGIC, to decrease the power consumption in the DRAM core 5, instead of using the VDCP 26 in the internal power supply voltage generation circuit/self-refresh timer block 15 of the DRAM core 5, the power supply voltage VCCP can be generated directly from the logic power supply VLOGIC. The DRAM can be of two external power supply scheme. When the power supply voltage VCCP is supplied from outside the DRAM, power consumption can be decreased and a drop in the power supply voltage VCCP under operating conditions can also be prevented.

FIG. 21 is an explanatory drawing schematically showing the rise of each internal power supply voltage when turning on two external power supplies in such a two external power supply scheme. This figure shows the case to turn on the logic voltage VLOGIC (i.e., the power supply voltage VCCP for peripheral circuits) after the expiration of a fixed time interval since the external power supply exVDD of 3.3V was turned on. When those power supplies are turned on in the reverse order, a lot of locations to which the voltage VCCP is connected exist in diffusion nodes within a well in a floating state wherein it has not been biased with VPP, VCCS, and VBB yet. Therefore, there is a danger that latch-up is caused by the electric current flowing into the well, and it is therefore preferable to turn on the power supplies by following the sequence shown in FIG. 21.

However, while the power supply voltage VCCP for peripheral circuits is 0V, the power supply voltages exVDD and VPP rise in the level shifter shown in FIG. 16(b) and 16(c). In this case, according to a large and small relationship of an off leakage current in the two N-channel transistors in the level shifter and the rise speed of the power supply exVDD or VPP, the output of the level shifter becomes either a "High" level or a "Low" level, that is, the output of the level shifter becomes an indeterminate state. Therefore, there may be the case the signal ZS0P is at a "Low" level when the signal S0N falls into a "High" state, for example, the sense drive circuit 38 shown in FIG. 17 is activated.

In addition, if the signal BLEQ has fallen into a "High" state in the row local control circuit 35 shown in FIG. 16(a), the sense drive circuit 38 is activated while the two bit line pairs and the lines S2P and S2N shown in FIG. 17 are equalized. As a result, a large penetration electric current flows from the voltage VCCS to GND. The voltage VCCS decreases by this penetration electric current, and the VCCS abnormality detector that is the voltage level detector in the VDCS 23 shown in FIG. 19 reacts. Therefore, the active VDCS is activated, and a large current flows from the external power supply exVDD.

On the other hand, the main word line (MWL) and the subdecode line (ZSDF) fall into a middle level without rising to the VPP level since the signal ZRST shown in FIG. 16(a) becomes an indeterminate state, too. As a result, there is a possibility that the penetration electric current keeps flowing in a lot of circuits and elements connected with the power supply VPP. In this case, the voltage VPP decreases and the VPP abnormality detector in the VPP generation circuit 25 shown in FIG. 18 therefore reacts. Therefore, the active VPP generator is activated, and a large current flows from the external power supply exVDD.

For example, Japanese patent application publication (TOKKAIHEI) No. 9-98083 showing a level shifter that is reset by a power-on reset signal and Japanese patent application publication (TOKKAIHEI) No. 7-231252 showing prevention of a penetration electric current by adding a pull-up resistor or a pull-down resistor to a level shifter, etc. disclose such prior art semiconductor integrated circuits as mentioned above.

A problem with a prior art semiconductor integrated circuit constructed as above is that when a DRAM included in the semiconductor integrated circuit is of two external power supply scheme, a penetration electric current flows due to an indeterminate output of a level shifter of a row local control circuit, a voltage VCCS or VPP decreases due to the penetration electric current and therefore either a VCCS abnormality detector of a VDCS or a VPP abnormality detector of a VPP generation circuit reacts, and an active VDCS or an active VPP generator is activated and a large current flowing from an external power supply exVDD causes an abnormal increase in the amount of current flowing in the semiconductor integrated circuit.

SUMMARY OF THE INVENTION

The present invention is proposed to solve the above-mentioned problem, and it is therefore an object of the present invention to provide a semiconductor integrated circuit that prevents an abnormal increase in the amount of current flowing in the semiconductor integrated circuit until internal power supply voltages rise at fixed levels on power-up even when a DRAM included in the semiconductor integrated circuit is of two external power supply scheme.

In accordance with an aspect of the present invention, there is provided a semiconductor integrated circuit including a logic, a memory, and a voltage generation unit for generating two or more internal power supply voltages based on two or more external power supply voltages supplied from outside the voltage generation unit with different timings and for furnishing the plurality of internal power supply voltages to the memory, the voltage generation unit comprising: a standby unit with a small current-feed ability that is always activated, for generating the plurality of internal power supply voltages; an active unit with a large current-feed ability that is activated as needed, for generating the plurality of internal power supply voltages; and an activation control unit for preventing the active unit from being activated until all of the plurality of external power supply voltages rise.

In accordance with another aspect of the present invention, the activation control unit is an activation signal control circuit for outputting an activation signal to activate the active unit after all of the plurality of external power supply voltages rise.

In accordance with a further aspect of the present invention, the activation control unit is an activation signal control circuit for outputting an activation signal to activate the active unit in response to a power-on reset signal generated after all of the plurality of external power supply voltages rise.

In accordance with another aspect of the present invention, the activation control unit includes a level shifter provided with either a pull-up transistor or a pull-down transistor, for converting a level of the activation signal to activate the active unit.

In accordance with a further aspect of the present invention, the activation control unit includes a level shifter provided with a substrate bias control circuit for throwing he level shifter out of balance, for converting a level of he activation signal to activate the active unit.

In accordance with another aspect of the present invention, there is provided a semiconductor integrated circuit including a logic, a memory, and a voltage generation unit for generating two or more internal power supply voltages based on two external power supply voltages supplied from outside the voltage generation unit with different timings and for furnishing the plurality of internal power supply voltages to the memory, the circuit comprising: a main power source line to which one of the two external power supply voltages which rises later is applied; a sub-power source line for supplying the external power supply voltage which rises later to a peripheral circuit block; and a precharge unit for disconnecting the sub-power source line from the main power source line until a power-on reset signal is generated in response to a rising of the external power supply voltage which rises later, and for charging the sub-power source line up to a fixed level.

In accordance with a further aspect of the present invention, the precharge unit precharges the sub-power source line up to the fixed level until the power-on reset signal is generated in response to the rising of the external power supply voltage which rises later after another power-on reset signal is generated in response to a rising of the other one of the two external power supply voltages which rises previously.

Further objects and advantages of the present invention will be apparent from the following description of the preferred embodiments of the invention as illustrated in the accompanying drawings.

DETAILED DESCRIPTION OF THE PREFERRED EMBODIMENTS

Embodiment 1

Figure 1:
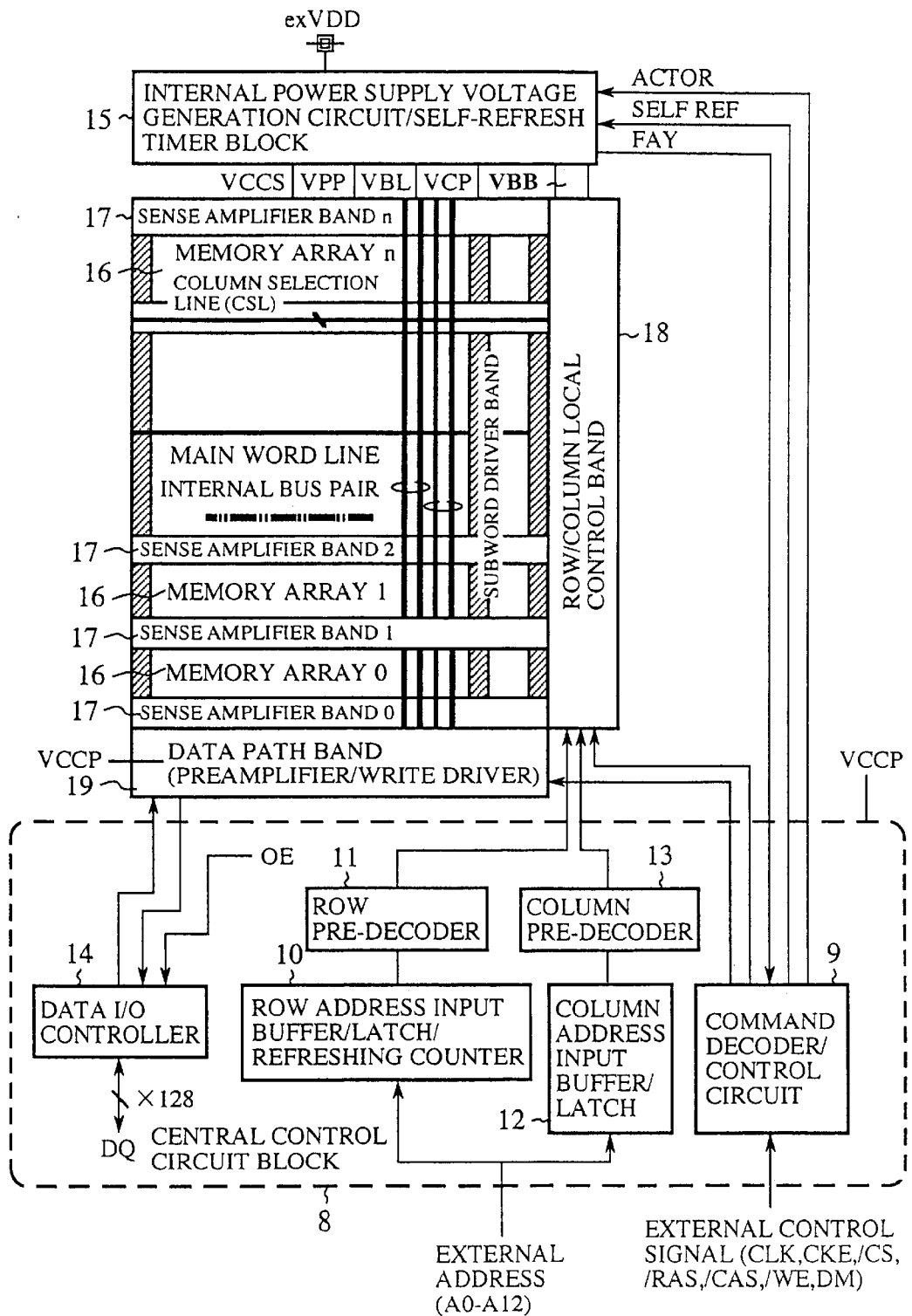
FIG. 1 is a block diagram showing the structure of a DRAM disposed in a semiconductor integrated circuit according to a first embodiment of the present invention.

FIG. 1 is a block diagram showing the structure of a DRAM of two external power supply scheme disposed in a semiconductor integrated circuit according to a first embodiment of the present invention. In the figure, reference numeral 8 denotes a central control circuit block. The central control circuit block 8 includes a command decoder/control circuit 9, a row address input buffer/latch/refreshing counter 10, a row pre-decoder 11, a column address input buffer/latch 12, a column pre-decoder 13, and a data I/O controller 14. Reference numeral 15 denotes an internal power supply voltage generation circuit/self-refresh timer block including an internal power supply voltage generation circuit for generating various internal power supply voltages. The internal power supply voltage generation circuit operates from an external power supply exVDD. Reference numeral 16 denotes a memory array in which a plurality of memory cells (not shown in the figure) are arranged in a matrix form and the plurality of memory cells are divided into a plurality of blocks, numeral 17 denotes a sense amplifier band, numeral 18 denotes a row/column local control band including a row decoder and a column decoder, and numeral 19 denotes a data path band including preamplifiers and write drivers. A power supply voltage VCCP for peripheral circuits is supplied from an external logic power supply.

In operation, various control signals, such as a clock enable signal CKE, a row address strobing signal /RAS, a column address strobing signal /CAS, a write enable signal /WE, and a data mask signal DM, are applied from outside the DRAM shown in FIG. 1 to the central control circuit block 8 of the DRAM. The central control circuit block 8 latches these control signals in synchronization with a clock signal CLK applied thereto from outside the DRAM, and decodes them using the command decoder/control circuit 9. The central control circuit block 8 specifies an internal command by decoding those control signals. This internal command includes a row active command, a read command, a write command, a precharge command, a auto-refresh command, a self-refresh command, etc.

Two or more internal control signals are activated in response to one of these commands. For instance, when the decoded control signals associated with an internal command issued indicate row activation, the row address input buffer/latch/refreshing counter 10 takes in an external address as a row address. The row pre-decoder 11 generates a pre-decode signal and various row control timing signals to drive a word line and a sense amplifier. When a read or write command is issued, the column address input buffer/latch 12 takes in an external address as a column address. The column pre-decoder 13 generates a column pre-decode signal, a column selection signal (CSL) and various column control timing signals to drive a preamplifier and a write driver in the data path band, and the data I/O controller 14.

When either an auto-refresh command or a self-refresh command is issued, a refreshing counter unit in the row address input buffer/latch/refreshing counter 10 starts working and generates one or more addresses specifying one or more rows to be refreshed. Particularly, when the DRAM is placed in self-refresh mode, a self-refresh timer unit in the internal power supply voltage generation circuit/self-refresh timer block 15 starts working and generates a refreshing trigger signal (FAY) automatically so as to refresh all rows once within a maximum refreshing time period (tREFmax). In addition, the internal power supply voltage generation circuit unit in the internal power supply voltage generation circuit/self-refresh timer block 15 generates a boosted voltage VPP, an array power supply voltage VCCS, a precharge voltage VBL, a cell plate voltage VCP, and a substrate voltage VBB.

The boosted voltage VPP is a voltage mainly transmitted to subword lines. To ensure the sufficiently writing of "High" data into any memory cell included in each memory array 16, and the sufficiently reading of "High" data from any memory cell to a bit line, the drive voltage VPP necessary for subword lines has to be very higher than the sum of the array power supply voltage VCCS and the threshold voltage VthC of memory cell transistors. The power supply voltage VCCP is delivered to peripheral circuits, such as the row decoder and the column decoder included in the row/column local control band 18, the write drivers and the preamplifiers included in the data path band 19, and the command decoder/control circuit 9, the row and column pre-decoders 11 and 13, the row address input buffer/latch/refreshing counter 10, the column address input buffer/latch 12, and the data I/O controller 14 included in the central control circuit block 8. The array power supply voltage VCCS is delivered to the sense amplifier band 17 that runs from the voltage.

Figure 2:
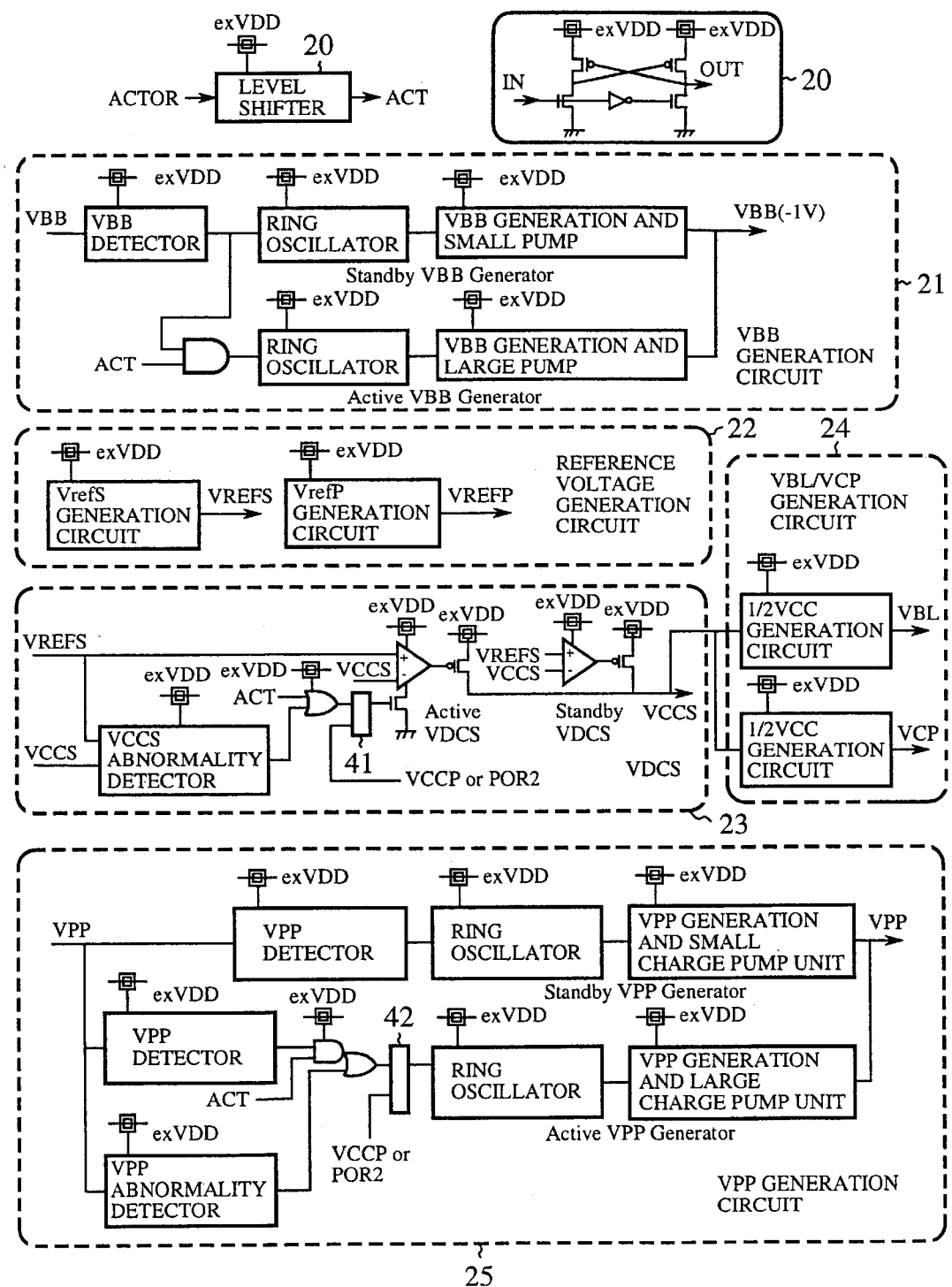
FIG. 2 is a block diagram showing the structure of an internal power supply voltage generation circuit of the DRAM of the semiconductor integrated circuit according to the first embodiment of the present invention.

FIG. 2 is a block diagram showing the structure of the internal power supply voltage generation circuit disposed in the internal power supply voltage generation circuit/self-refresh timer block 15 of the semiconductor integrated circuit according to the first embodiment of the present invention. In the figure, reference numeral 20 denotes a level shifter, numeral 21 denotes a VBB generation circuit, numeral 22 denotes a reference voltage generation circuit, numeral 23 denotes a VDCS, numeral 24 denotes a VBL/VCP generation circuit, and numeral 25 denotes a VPP generation circuit. In other words, the internal power supply voltage generation circuit block contains the level shifter 20 and these voltage generation circuits. The VBB generation circuit 21 has an active VBB generator as an active circuit having a large current-feed ability, and a Standby VBB generator as a standby circuit having a small current-feed ability in parallel. Similarly, the VDCS 23 has an active VDCS as an active circuit having a large current-feed ability, and a Standby VDCS as a standby circuit having a small current-feed ability in parallel. Similarly, the VPP generation circuit 25 has an active VPP generator as an active circuit having a large current-feed ability, and a Standby VPP generator as a standby circuit having a small current-feed ability in parallel.

In the internal power supply voltage generation circuit, the Standby VBB generator of the VBB generation circuit 21, the Standby VDCS of VDCS 23, and the Standby VPP generator of the VPP generation circuit 25 are activated at all times to maintain the voltage levels of all kinds of internal power supply lines during the standby time period. When the decoded control signals indicate row activation for a write or read operation, or a self-refresh operation or an auto-refresh operation, the command decoder/control circuit 9 generates an ACTOR signal. This ACTOR signal is converted into an ACT signal by a level shifter 20 for converting a signal at the VCCP level into an equivalent signal at the exVDD level, and the ACT signal is sent to the VBB generation circuit 21, the VDCS 23, and the VPP generation circuit 25. The VBB generation circuit 21 activates the active VBB generator in response to the ACT signal. Similarly, the VDCS 23 activates the active VDCS in response to the ACT signal, and the VPP generation circuit 25 activates the active VPP generator in response to the ACT signal.

A VCCS abnormality detector included in the VDCS 23 always monitors the array power supply voltage VCCS, and when the voltage level decreases abnormally, raises its output signal from a "Low" level to a "High" level. Similarly, a VPP abnormality detector included in the VPP generation circuit 25 always monitors the boosted voltage VPP, and when the voltage level decreases abnormally, raises its output signal from a "Low" level to a "High" level. As a result, the active VDCS of the VDCS 23 and the active VPP generator of the VPP generation circuit 25 are activated respectively. When the monitored voltage level decreases abnormally even within the standby time period during which the DRAM is on standby, the VDCS 23 and the VPP generation circuit 25 activate the active VDCS and the active VPP generator, respectively, in response to the output signals of the respective abnormality detectors. Thus, the internal power supply voltage generation circuit can recover the voltage levels to their normal values by activating the active VDCS and the active VPP generator.

The VDCS 23 according to the first embodiment has an active VDCS activation signal control circuit 41 for generating an active VDCS activation signal, which is disposed between the output of an OR gate for implementing the logical OR operation on the ACT signal and the output of the VCCS abnormality detector and the gate of an N-channel transistor of the active VDCS. The active VDCS activation signal control circuit 41 keeps its output at a "Low" level so as to prevent the active VDCS from being activated until the power supply voltage VCCP rises or a second power-on reset signal POR2 generated upon the rising of the power supply voltage VCCP rises. When the power supply voltage VCCP or the POR2 signal rises, the active VDCS activation signal control circuit 41 brings the active VDCS into a state in which it can be activated in response to the ACT signal or the output of the VCCS abnormality detector.

Figure 3:
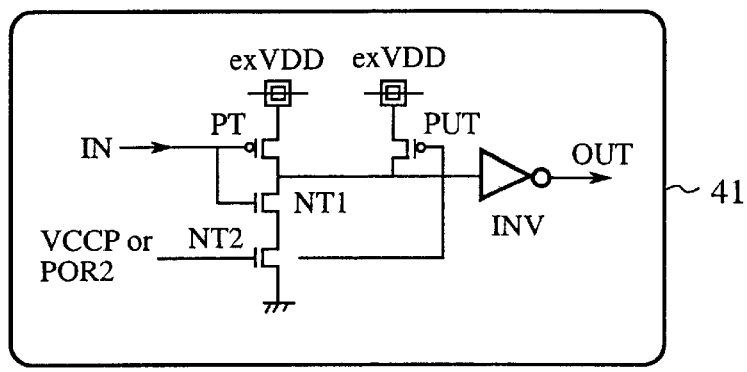
FIG. 3 is a schematic circuit diagram showing the structure of an activation signal control circuit included in the internal power supply voltage generation circuit shown in FIG. 2.
Figure 4:
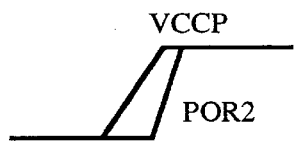
FIG. 4 is an explanatory drawing for showing a relationship with respect to time between a power supply voltage VCCP supplied from outside the DRAM of the semiconductor integrated circuit according to the first embodiment and a second power-on reset signal.

FIG. 3 is a block diagram showing the structure of the active VDCS activation signal control circuit 41. As shown in the figure, the active VDCS activation signal control circuit 41 includes a P-channel transistor PT and an N-channel transistor NT1 connected in series, which receive an input from the OR gate of the VDCS 23, an N-channel transistor NT2 connected in series with the N-channel transistor NT1, which receives either the power supply voltage VCCP or the second power-on reset signal POR2, a P-channel pull-up transistor PUT connected in parallel with the P-channel transistor PT, which receives either the power supply voltage VCCP or the second power-on reset signal POR2, and an inverter INV that inverts an output signal from a node between the P-channel transistor PT and the N-channel transistor NT1. FIG. 4 shows a relationship with respect to time between the power supply voltage VCCP and the second power-on reset signal POR2.

The VPP generation circuit 25 according to the first embodiment has an active VPP activation signal control circuit 42 for generating an active VPP activation signal, which is inserted before the input of a ring oscillator included in the active VPP generator. Like the active VDCS activation signal control circuit 41, the active VPP activation signal control circuit 42 keeps its output at a "Low" level so as to prevent the active VPP generator from being activated until the power supply voltage VCCP rises or the second power-on reset signal POR2 generated upon the rising of the power supply voltage VCCP rises. When the power supply voltage VCCP rises or the POR2 signal rises, the active VPP activation signal control circuit 42 brings the active VPP generator into a state in which it can be activated in response to either the ACT signal or the output of the VPP abnormality detector. The active VPP activation signal control circuit 42 has the same structure as the active VDCS activation signal control circuit 41 shown in FIG. 3.

Figure 15:
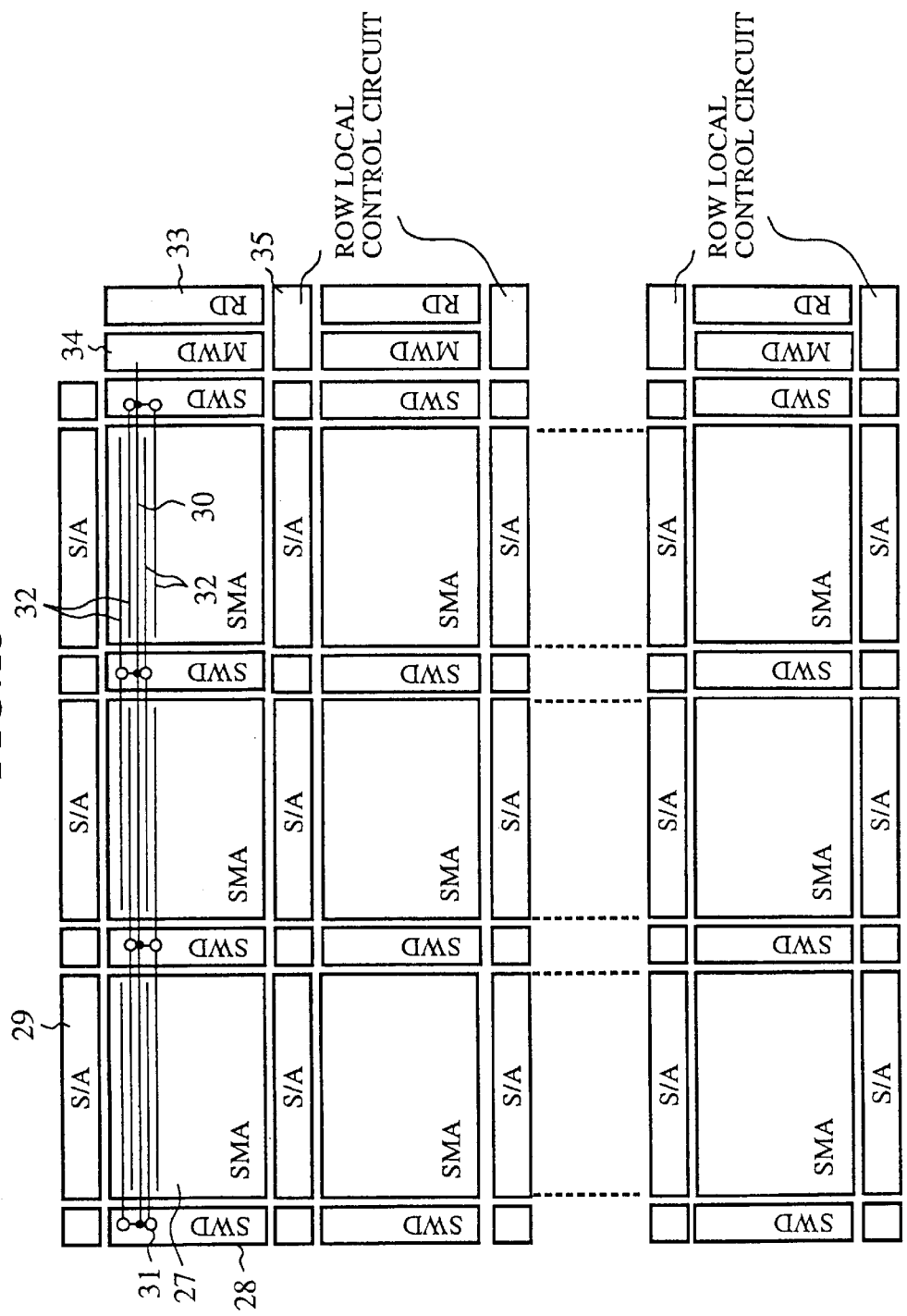
FIG. 15 is a block diagram showing the structure of memory arrays.

The memory array 16 shown in FIG. 1 has the structure shown in FIG. 15. As shown in FIG. 15, the memory array 16 is divided into a number of submemory arrays (SMA) 27, and two subword driver bands (SWD) 28 and two sense amplifier bands (S/A) 29 are arranged around each of the plurality of submemory arrays 27. A plurality of main word lines 30 are arranged in a series of two or more submemory arrays 27 arranged in a row so that they extend in the row and are across the two or more submemory arrays 27. Two or more subword lines 32 are connected with each main word line 30 by way of subword drivers 31. Each main word line 30 is driven by a main word driver (MWD) 34 that operates from a signal from a row decoder (RD) 33.

Figure 16A:
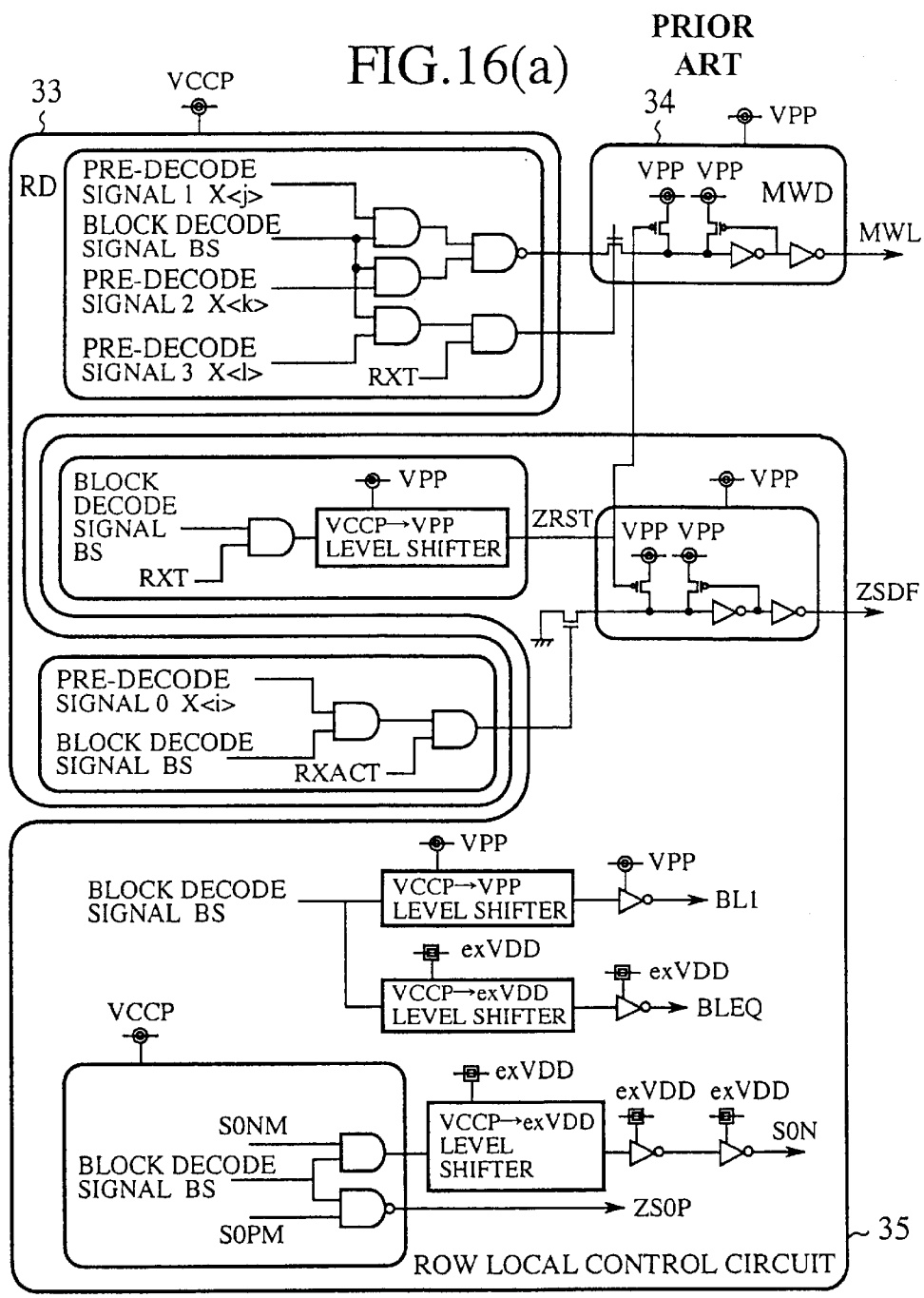
FIG. 16(a) is a block diagram showing the structure of a row decoder, a main word driver, and a row local control circuit of a row/column local control band.

The row/column local control band 18 shown in FIG. 1 includes a row decoder 33, a column decoder (not shown in the figure), a main word driver 34, and a row local control circuit 35 containing a sense amplifier drive signal generation circuit and a subdecode signal generation circuit. The structures of the row decoder 33, the main word driver 34 and the row local control circuit 35 of the row/column local control band 18 are as shown in FIG. 16(a). The column decoder is not shown in FIG. 16(a).

As shown in FIG. 16(a), the row decoder 33 includes a circuit for generating a signal to select a main word line (MWL) from a block decode signal BS, pre-decode signals 1 to 3, and a timing control signal RXT, and a circuit for generating a signal to select a subdecode line (ZSDF) from the block decode signal BS, a pre-decode signal 0, and a timing control signal RXACT. The row decoder 33 is driven by the power supply voltage VCCP for peripheral circuits. The main word driver 34 includes a circuit for driving a main word line (MWL) with an amplitude at the VPP level in response to the signal to select the main word line, which is generated by the row decoder 33.

The row local control circuit 35 includes a circuit for driving a subdecode line (ZSDF) with an amplitude at the VPP level in response to the signal to select the subdecode line, which is generated by the row decoder 33, a circuit for generating a ZRST signal with an amplitude at the VPP level to return both the main word line and the subdecode line to the VPP level when the assertion of the decoded control signals is reset by an internal precharge command or the like, and a circuit for generating a shared gate signal BLI and a bit line precharge signal BLEQ from the block decode signal BS to control a sense amplifier, and for generating sense activation signals S0N and ZS0P from sense application activation timing master signals S0NM and S0PM from the central control circuit block 8.

Figure 16B:
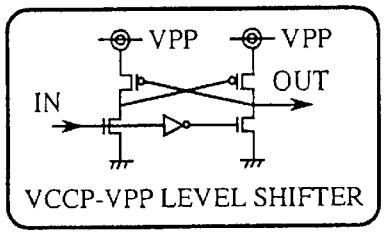
FIG. 16(b) is a schematic circuit diagram showing the structure of a VCCP-VPP level shifter.
Figure 16C:
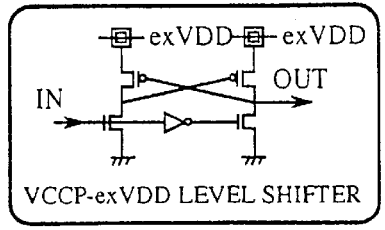
FIG. 16(c) is a schematic circuit diagram showing the structure of VCCP-exVDD level shifter.

In addition, the row local control circuit 35 has two VCCP-VPP level shifters shown in FIG. 16(b), for converting a signal at the VCCP level into an equivalent signal at the VPP level and two VCCP-exVDD level shifters shown in FIG. 16(c), for converting a signal at the VCCP level into an equivalent signal at the exVDD level. The first VCCP-VPP level shifter generates the ZRST signal with an amplitude at the VPP level, which is included in the row control signal group, from the block decode signal BS and the timing control signal RXACT with an amplitude at the VCCP level. The second VCCP-VPP level shifter generates the BLI signal with an amplitude at the VPP level, which is included in the row control signal group, from the block decode signal BS with an amplitude at the VCCP level. The first VCCP-exVDD level shifter generates the BLEQ signal with an amplitude at the exVDD level, which is included in the row control signal group, from the block decode signal BS with an amplitude at the VCCP level. The second VCCP-exVDD level shifter generates the S0N signal with an amplitude at the exVDD level, which is included in the row control signal group, from the block decode signal BS with an amplitude at the VCCP level, and the sense application activation timing master signals S0NM and S0PM.

Figure 17:
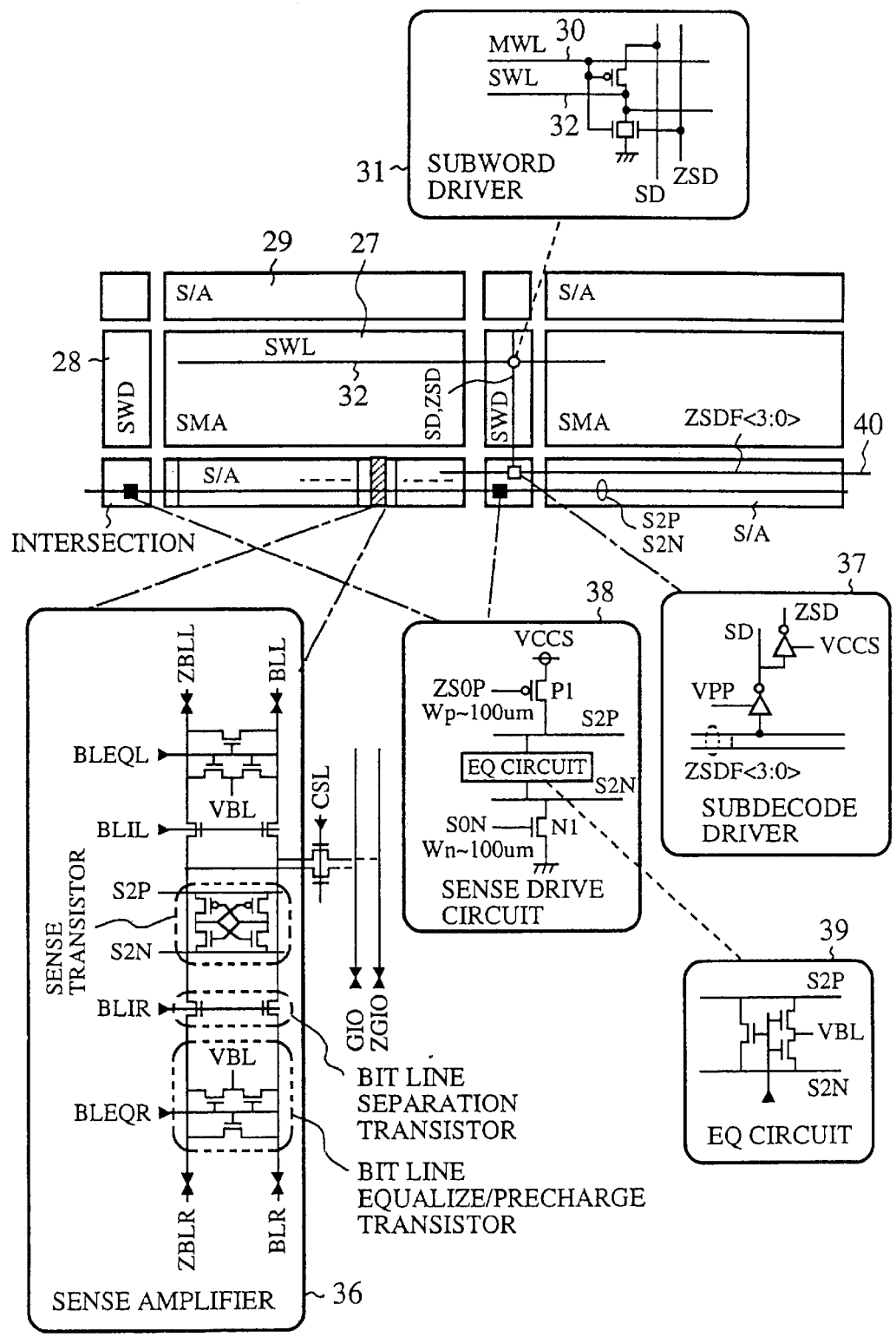
FIG. 17 is a block diagram showing the structure of a sense amplifier and a subword driver.
Figure 18:
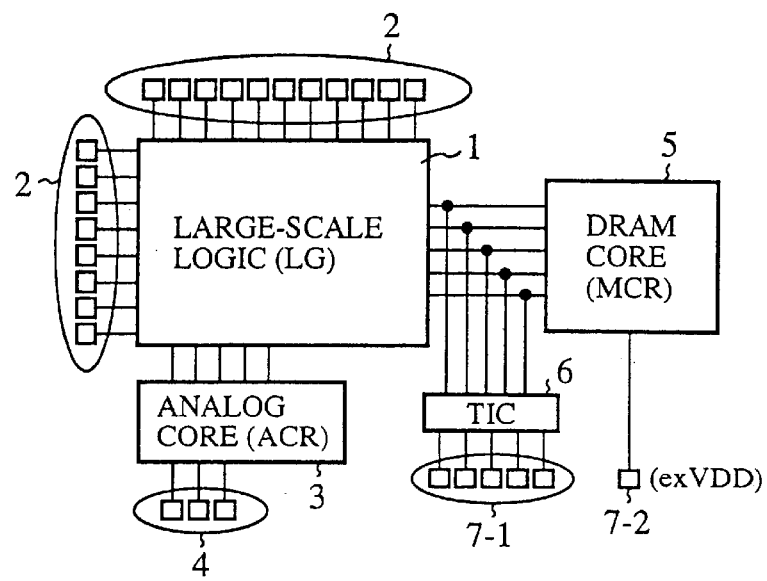
FIG. 18 is a block diagram showing the structure of a general system LSI in which a DRAM and a logic are merged.
Figure 20:
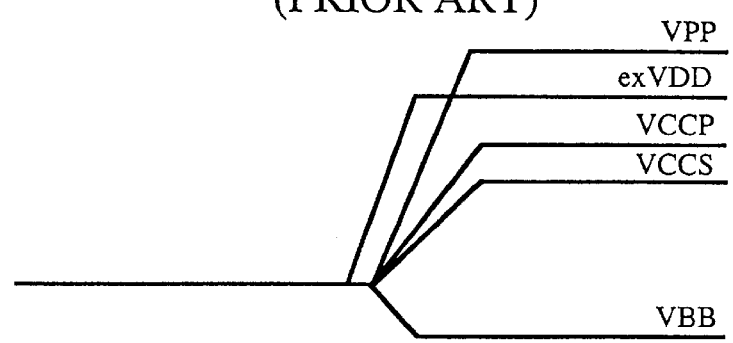
FIG. 20 is an explanatory drawing for showing a relationship with respect to time between power supply turning on in a conventional DRAM of one external power supply structure and the rises of internal power supply voltages generated.
Figure 21:
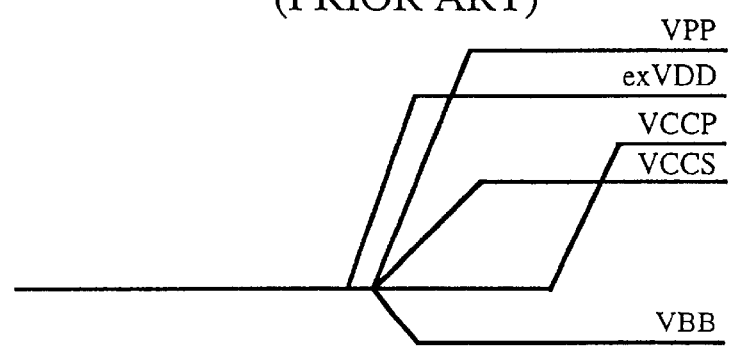
FIG. 21 is an explanatory drawing for showing a relationship with respect to time between power supply turning on in a conventional DRAM of two external power supply scheme and the rises of internal power supply voltages generated.
Figure 19:
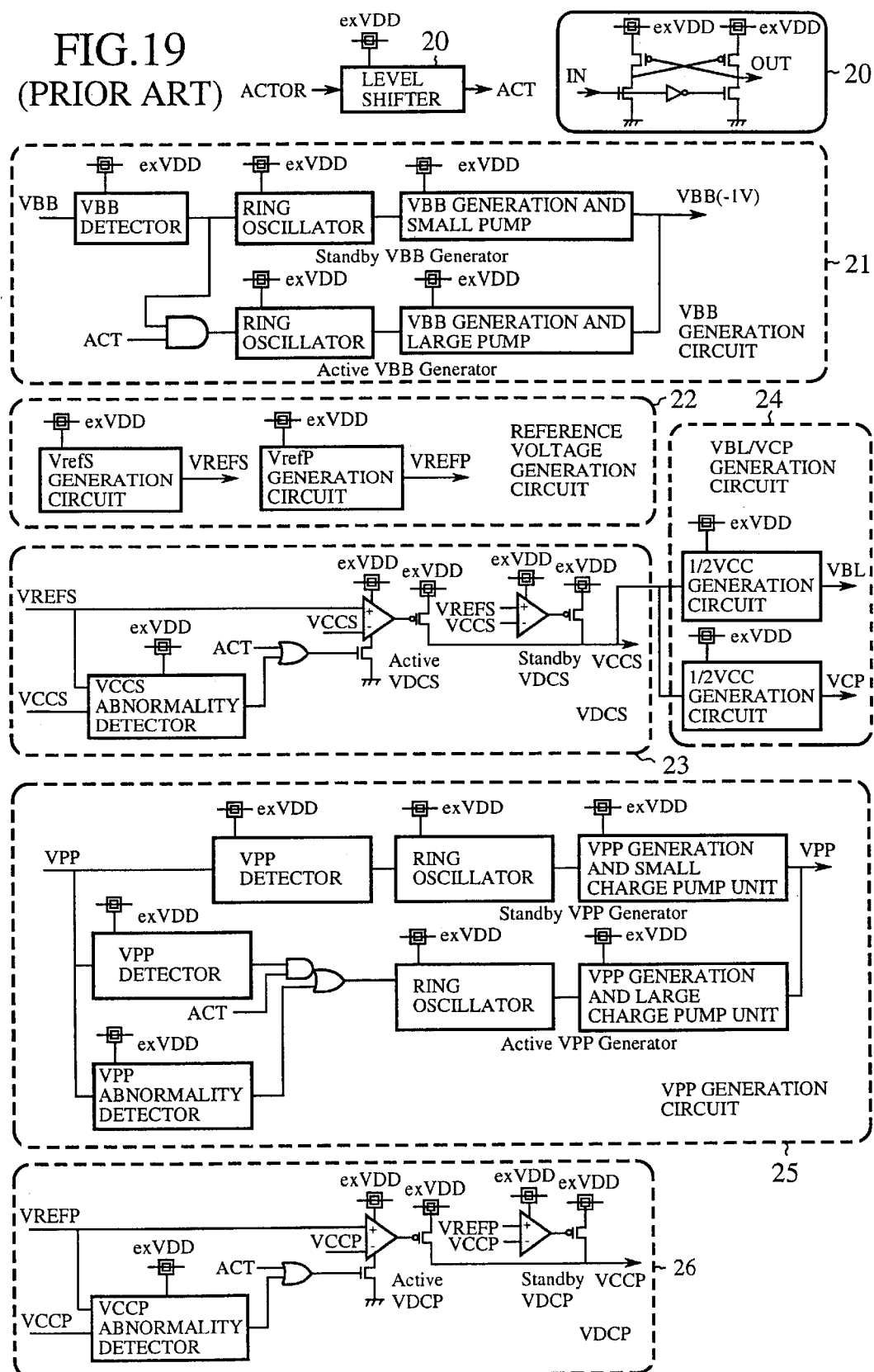
FIG. 19 is a block diagram showing the structure of an internal power supply voltage generation circuit of a prior art semiconductor integrated circuit.

The connection between each submemory array 27 in FIG. 15 and both a subword driver band 28 and a sense amplifier band 29 arranged around each submemory array 27 is as shown in FIG. 17. Each submemory array 27 includes a plurality of memory cells (not shown in the figure) arranged in the form of an array, and the gates of a plurality of memory cells arranged in the same row is connected with an identical subword line 32. The subword line 32 is connected with each subword driver 31 located in one subword driver band 28 surrounding each submemory array 27. A plurality of memory cells arranged in the same column are connected with either a pair of bit lines BLL and ZBLL or another pair of bit lines BLR and ZBLR. Each of these two bit line pairs is connected with a sense transistor by way of a bit line separation transistor having a gate to which a shared gate signal BLIL or BLIR is input. Reference numeral 37 in FIG. 17 denotes a subdecode driver, numeral 38 denotes a sense drive circuit, and numeral 39 denotes an EQ circuit located in the sense drive circuit 38.

In addition to the sense transistor and the pair of bit line separation transistors, the sense amplifier 36 includes a pair of bit line equalize/precharge transistors each having a gate to which a bit line precharge signal BLEQL or BLEQR is input and equalizing a corresponding bit line pair during the standby time period to precharge the bit line pair so that the bit line pair has a precharge voltage level VBL. The pair of bit line equalize/precharge transistors can be arranged on the sense transistor side, i.e., inside the pair of bit line separation transistors in the sense amplifier 36, not outside the pair of bit line separation transistors as shown in FIG. 17.

Each subword driver 31 operates as follows. Each main word line 30 and each subdecode line (ZSDF) 40 are both maintained at the VPP level in the state of non-selection. The levels of a main word line 30 and a subdecode line 40 selected fall from the VPP level to a "Low" level when the decoded control signals associated with an internal command issued indicate row activation. In the subword driver 31 arranged in the intersection shown in FIG. 17, a signal SD from the subdecode driver 37 connected with the selected subdecode line 40 changes from the "Low" level to the VPP level, and a signal ZSD changes from the VCCS level to the "Low" level. The subword driver 31 raises the level of the subword line 32 selected by a main word line 30 and a subdecode line 40 from a "Low" level to the VPP level in response to these signal changes. The main word line 30 and the subdecode line 40 which have been selected return to the VPP level again when the assertion of the decoded control signals is reset by an internal precharge command or the like and the DRAM returns to the standby state, and the level of the subword line 32 falls from the VPP level to the "Low" level.

The sense amplifier 36 operates as follows. The pair of bit line separation transistors is maintained at the VPP level by the shared gate signals BLIL and BLIR before the corresponding subword line 32 rises. Furthermore, since the two bit line precharge signals BLEQL and BLEQR are at a "High" level, the pair of bit line equalize/precharge transistors maintains the two bit line pairs at the bit line precharge voltage level VBL, respectively. The gate levels of one of the pair of bit line separation transistors and a corresponding one of the pair of bit line equalize/precharge transistors fall to the "Low" level immediately before the subword line 32 rises. For instance, when a subword line 32 in a memory array on the side of a pair of bit lines BLL and ZBLL rises, both the gate level of one bit line separation transistor to which the shared gate signal BLIR is input and the gate level of one bit line equalize/precharge transistor to which the bit line precharge signal BLEQL is input fall to the "Low" level.

Thus, when the pair of bit lines BLL and ZBLL enters a floating state while it is held at the bit line precharge voltage level VBL, and a corresponding subword line 32 rises, the storage node of the selected memory cell is connected with one of the bit line pair, and the electric charge on the capacitor in the memory cell is read out to the bit line pair. By making the sense activation signal S0N become a "High" level and making the ZS0N signal become a "Low" level when the electric charge of the memory cell is completely read out to the bit line pair, the sense drive circuit 38 arranged in the intersection of FIG. 17 is made to operate, and all sense transistors on the corresponding sense amplifier band 29 are activated together by the output signals S2P and S2N of the sense drive circuit 38. To speed up the bit line precharge and to do the sense operation at high speed, the bit line precharge signal BLEQL, BLEQR, and the sense activation signal S0N are driven at the exVDD level.

Thus, the basic operation of the semiconductor integrated circuit according to the first embodiment is similar to that in a prior art case. As previously mentioned, according to the first embodiment, after either the power supply voltage VCCP or the POR2 signal rises, the active VDCS activation signal control circuit 41 of the VDCS 23 performs a control operation so that the active VDCS can be activated in response to the ACT signal which has been converted from the ACTOR signal or when an abnormal decrease in the output voltage VCCS is detected by the corresponding abnormality detector. Similarly, the active VPP activation signal control circuit 42 of the VPP generation circuit 25 performs a control operation so that the active VPP generator can be activated in response to the ACT signal which has been converted from the ACTOR signal or when an abnormal decrease in the output voltage VPP is detected by the corresponding abnormality detector. Therefore, even when receiving the ACT signal or an abnormality detection signal indicating an abnormal drop in a monitored voltage level, neither the active VDCS nor the active VPP generator are activated until either the power supply voltage VCCP or the POR2 signal rises, and in the meanwhile the internal power supply voltage generation circuit supplies the array power supply voltage VCCS and the boosted voltage VPP using the Standby VDCS and the Standby VPP generator.

As mentioned above, according to the first embodiment of the present invention, since the VDCS 23 and the VPP generation circuit 25 within the internal power supply voltage generation circuit have the active VDCS activation signal control circuit 41 and the active VPP activation signal control circuit 42, respectively, it is possible to prevent the active circuits with a large current-feed ability, such as the active VDCS and the active VPP generator, from being activated due to drops in the voltage levels of the corresponding internal power lines because of indeterminate states of internal nodes on power-up. Accordingly, the present embodiment offers an advantage of being able to prevent an abnormal increase in the amount of current flowing in the semiconductor integrated circuit.

Embodiment 2

Figure 5:
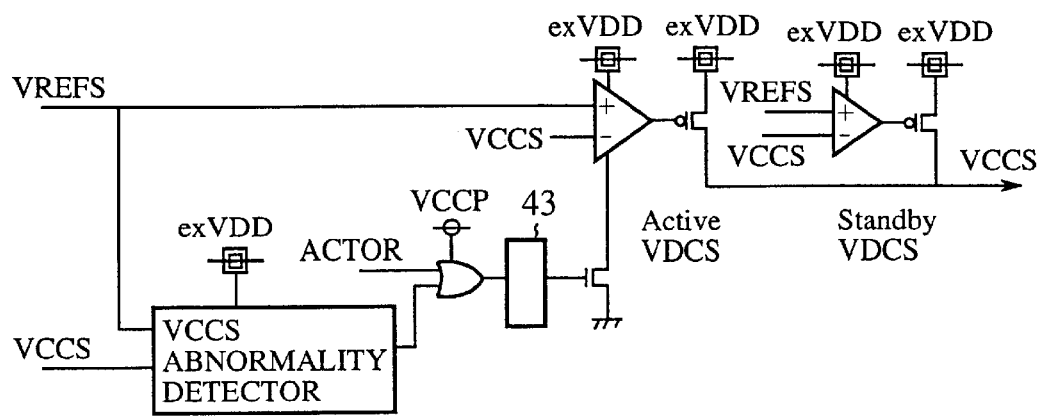
FIG. 5 is a block diagram showing the structure of a VDCS included in an internal power supply voltage generation circuit of a DRAM of a semiconductor integrated circuit according to a second embodiment of the present invention.

A VDCS 23 located in an internal power supply voltage generation circuit of a semiconductor integrated circuit according to a second embodiment generates an active VDCS activation signal using a level shifter, instead of the active VDCS activation signal control circuit mentioned above. FIG. 5 is a block diagram showing the structure of the VDCS 23 according to the second embodiment. In the figure, reference numeral 43 denotes a level shifter provided with either a pull-up transistor or a pull-down transistor, for converting an input signal at a VCCP level into an equivalent signal to an exVDD level.

Figure 6A:
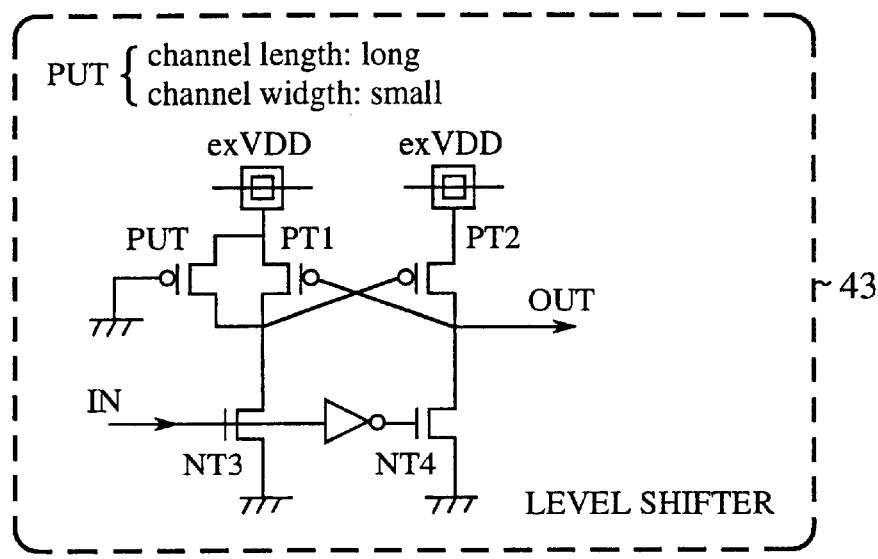
FIG. 6(a) is a schematic circuit diagram showing the structure of an example of a level shifter included in the VDCS shown in FIG. 5.
Figure 6B:
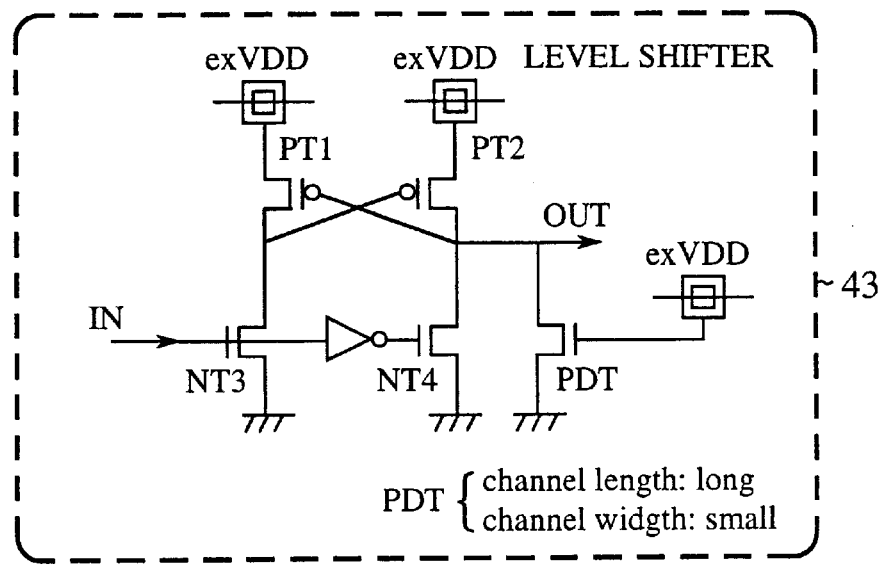
FIG. 6(b) is a schematic circuit diagram showing the structure of another example of the level shifter included in the VDCS shown in FIG. 5.

FIG. 6(a) is a block diagram showing the structure of an example of the level shifter 43, the example including a pull-up transistor whose channel length is long and whose channel width is small, and FIG. 6(b) is a block diagram showing the structure of another example of the level shifter 43, the other example including a pull-down transistor whose channel length is long and whose channel width is small. The pull-up transistor PUT included in the level shifter shown in FIG. 6(a) is a P-channel transistor connected in parallel with a P-channel transistor PT1 connected in series with an N-channel transistor NT3 to which an input signal not inverted is input. The pull-up transistor PUT has a gate connected with GND. The pull-down transistor PDT included in the level shifter shown in FIG. 6(b) is an N-channel transistor connected in parallel with an N-channel transistor NT4 connected to an output terminal of the level shifter. The pull-down transistor PDT has a gate connected with the power supply exVDD.

The VDCS 23 according to the second embodiment receives an ACTOR signal from a command decoder/control circuit 9 and an abnormality detection signal from a VCCS abnormality detector through an OR gate that runs from the power supply voltage VCCP. By generating an active VDCS activation signal by using the level shifter 43 provided with either the pull-up transistor PUT or the pull-down transistor PDT shown in FIG. 6(a) or 6(b), the VDCS 23 can keep the active VDCS activation signal at a "Low" level until the power supply voltage VCCP for peripheral circuits rises. As a result, the active VDCS cannot be activated while the power supply voltage VCCP does not rise, and in the meanwhile the VDCS 23 supplies an array power supply voltage VCCS using only a Standby VDCS.

As mentioned above, the second embodiment offers the same advantage as provided by the first embodiment. That is, it is possible to prevent the active VDCS from being activated due to a drop in the internal power lines of voltage VCCS because of indeterminate states of internal nodes on power-up, thereby preventing an abnormal increase in the amount of current flowing in the semiconductor integrated circuit.

Embodiment 3

Figure 7:
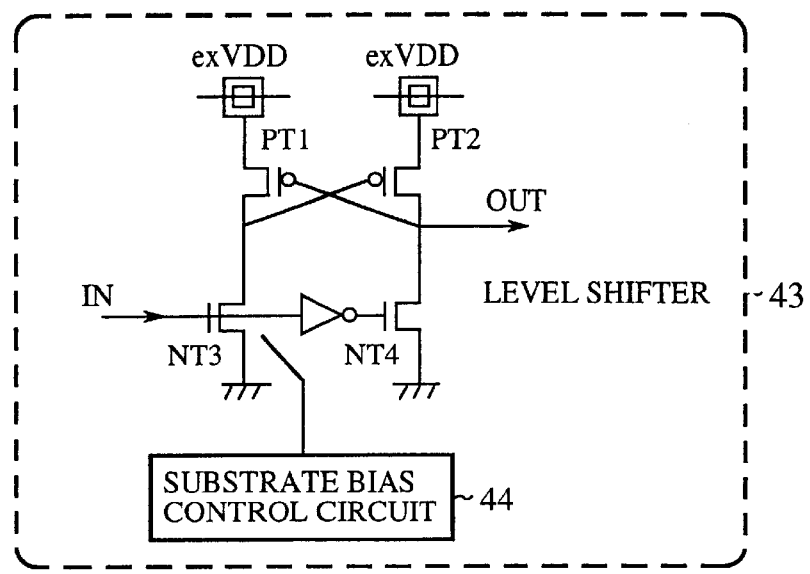
FIG. 7 is a schematic circuit diagram showing the structure of a level shifter of a VDCS included in an internal power supply voltage generation circuit of a DRAM of a semiconductor integrated circuit according to a third embodiment of the present invention.

A level shifter of a VDCS 23 according to a third embodiment of the present invention converts an input signal at a VCCP level into an equivalent signal at an exVDD level using a substrate bias control circuit, instead of the pull-up transistor or the pull-down transistor mentioned above in Embodiment 2. FIG. 7 is a schematic circuit diagram showing the structure of the level shifter of the VDCS 23 according to the third embodiment of the present invention. In the figure, reference numeral 44 denotes the substrate bias control circuit added to an N-channel transistor NT3 to which a signal not inverted is input.

Figure 8:
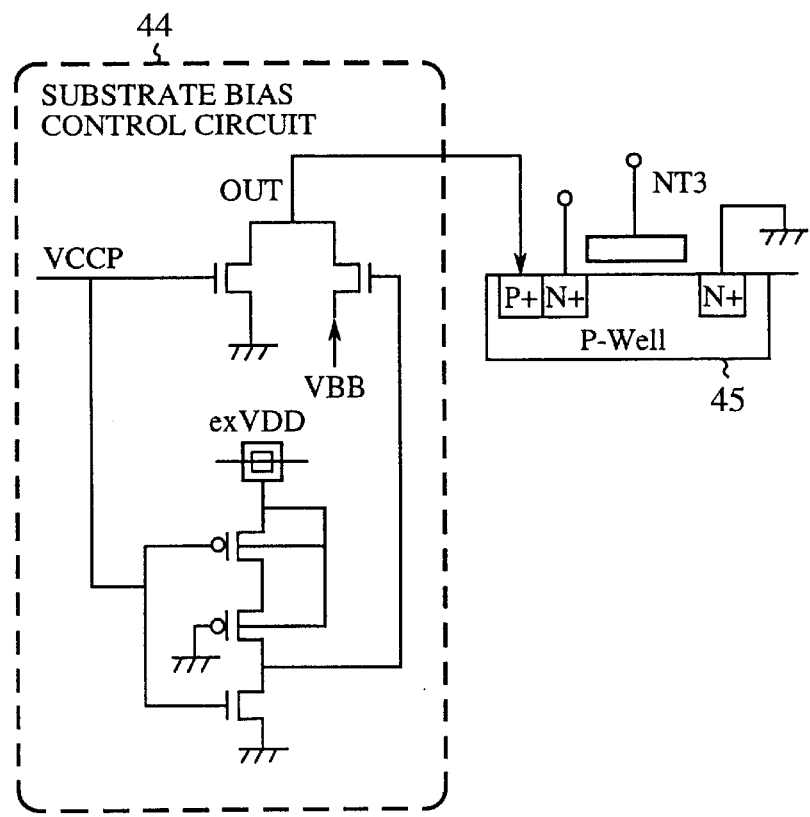
FIG. 8 is an explanatory drawing for showing the structure of a substrate bias control circuit included in the level shifter shown in FIG. 7, and connection of the substrate bias control circuit with an N-channel transistor.

FIG. 8 is a schematic circuit diagram showing the structure of the substrate bias control circuit 44 and the connection between the substrate bias control circuit 44 and the N-channel transistor NT3. In the figure, reference numeral 45 denotes a P-well whose well voltage is controlled by the substrate bias control circuit 44. The N-channel transistor NT3 within the level shifter 43 is arranged on the P-well 45. The VDCS 23 according to the third embodiment receives an ACTOR signal from a command decoder/control circuit 9 and an abnormality detection signal from a VCCS abnormality detector through an OR gate that runs from the power supply voltage VCCP, like the VDCS according to the second embodiment. The N-channel transistor NT3 within the level shifter 43 is arranged on the P-well 45 as shown in FIG. 8. The substrate bias control circuit 44 biases the P-well 45 up to a substrate voltage VBB until the power supply voltage VCCP for peripheral circuits rises. As a result, the substrate bias control circuit 44 makes the output of the level shifter 43 become a "Low" level by raising the threshold of the N-channel transistor NT3, and hence throwing the level shifter 43 out of balance. When the power supply voltage VCCP rises, the substrate bias control circuit 44 biases the P-well 45 at GND. As a result, the level shifter 43 operates as a normal level shifter.

Thus, the active VDCS cannot be activated while the power supply voltage vCCP does not rise, and the third embodiment of the present invention therefore offers the same advantage as provided by the above-mentioned second embodiment.

Embodiment 4

Figure 9:
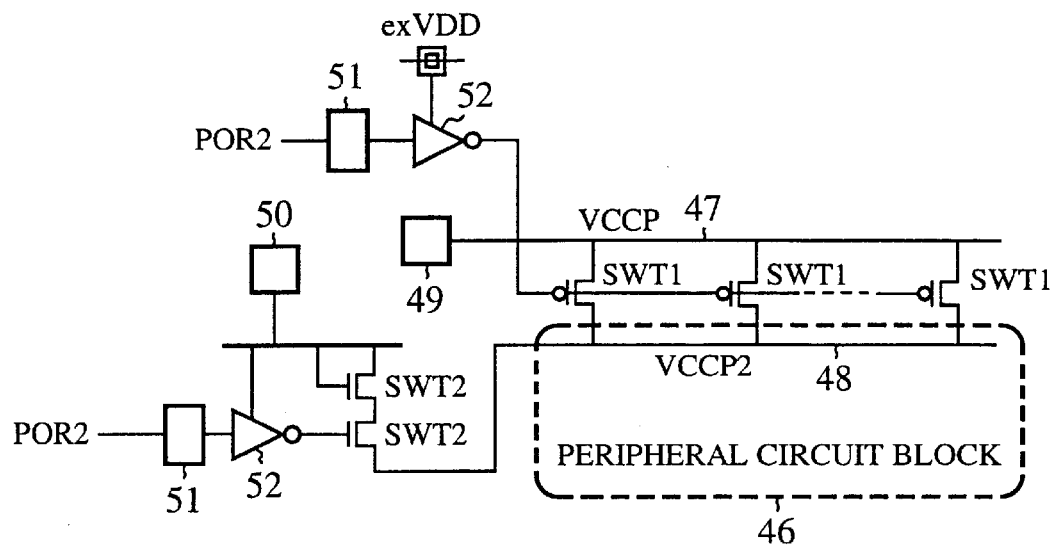
FIG. 9 is a schematic circuit diagram showing the structure of power supply hierarchy for peripheral circuits in a semiconductor integrated circuit according to a fourth embodiment of the present invention.
Figure 10:
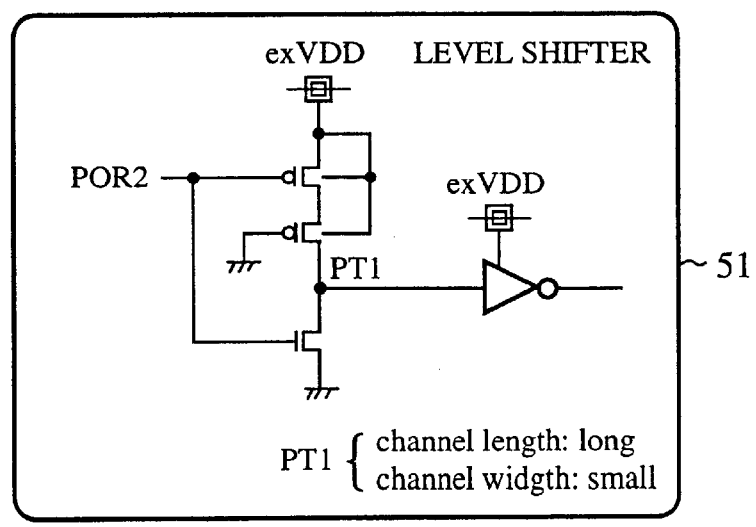
FIG. 10 is a schematic circuit diagram showing the structure of a level shifter disposed in the power supply hierarchy according to the fourth embodiment shown in FIG. 9.

FIG. 9 is a schematic circuit diagram showing the hierarchical structure of a power supply for peripheral circuits of a semiconductor integrated circuit according to a fourth embodiment of the present invention. In the figure, reference numeral 46 denotes a peripheral circuit block that receives a power supply voltage VCCP from the hierarchically-structured power supply and that includes a central control circuit block 8, a column local control band 18, a row/data path band 19, etc., and numerals 47 and 48 denote a main power source line and a sub-power source line which are arranged hierarchically, respectively. The main power source line 47 is connected with the sub-power source line 48 by way of two or more switch transistors SWT1 each of which consists of a P-channel transistor. Reference numeral 49 denotes a power supply pad to which the power supply voltage VCCP is input, and numeral 50 denotes another power supply pad to which a power supply voltage exVDD is input. The power supply pad 49 is connected directly with the main power source line 47, and the other power supply pad 50 is connected with the sub-power source line 48 by way of two switch transistors SWT2 in series, each of which consists of an N-channel transistor. Reference numeral 51 denotes a level shifter that converts a signal at the VCCP level into an equivalent signal at the exVDD level, the level shifter having a structure as schematically shown in FIG. 10. A combination of one level shifter 51 and one inverter 52 forms a control circuit for controlling the two or more switch transistors SWT1 as shown in FIG. 9. Another combination of one level shifter 51 and one inverter 52 forms another control circuit for controlling one of the two switch transistors SWT2, which is connected to the sub-power source line 48.

In the fourth embodiment, the sub-power source line 48 is arranged as power lines via which the power supply voltage VCCP is supplied to the peripheral circuit block 46 as shown in FIG. 9. The two or more switch transistors SWT1 arranged between the main power source line 47 and the sub-power source line 48 switch to the ON state when the power supply voltage VCCP rises and, after that, a second power-on reset signal POR2 rises. When the two or more switch transistors SWT1 are turned on, the VCCP power supply input from outside to the power supply pad 49 is supplied to the sub-power source line 48 by way of the main power source line 47 and the two or more switch transistors SWT1. In contrast, the sub-power source line 48 remains being disconnected from the main power source line 47 until the second power-on reset signal POR2 rises, because the two or more switch transistors SWT1 are held at the OFF state.

Until the second power-on reset signal POR2 rises, the two switch transistors SWT2 in series, which can connect the power supply exVDD with the sub-power source line 48 and precharge the sub-power source line 48 up to a proper voltage level, are held at the ON state. Therefore, a voltage which falls from the power supply exVDD input to the power supply pad 50 only by the thresholds of those two switch transistors SWT2 is supplied to the sub-power source line 48. Only to set the peripheral circuit block 46 in a standby state so that internal nodes of the peripheral circuit block should not become an indeterminate state, the power supply voltage is supplied to the sub-power source line 48. Therefore, the size of the N-channel transistor which constructs each of the two switch transistors SWT2 is set such that the power supply voltage supplied to the sub-power source line 48 is not too large. Since the switch transistor SWT2 controlled by the combination of one level shifter 51 and one inverter 52 becomes the OFF state when the second power-on reset signal POR2 rises, the power supply exVDD is disconnected from the sub-power source line 48.

As mentioned above, according to the fourth embodiment, the sub-power source line 48 is precharged up to a proper voltage level until the second power-on reset signal POR2 rises after the power supply voltage VCCP has risen. Accordingly, the fourth embodiment offers an advantage of being able to maintain the internal power supply voltage at a fixed voltage level, and to prevent an abnormal increase in the amount of current flowing in the semiconductor integrated circuit on power-up.

Embodiment 5

Figure 11:
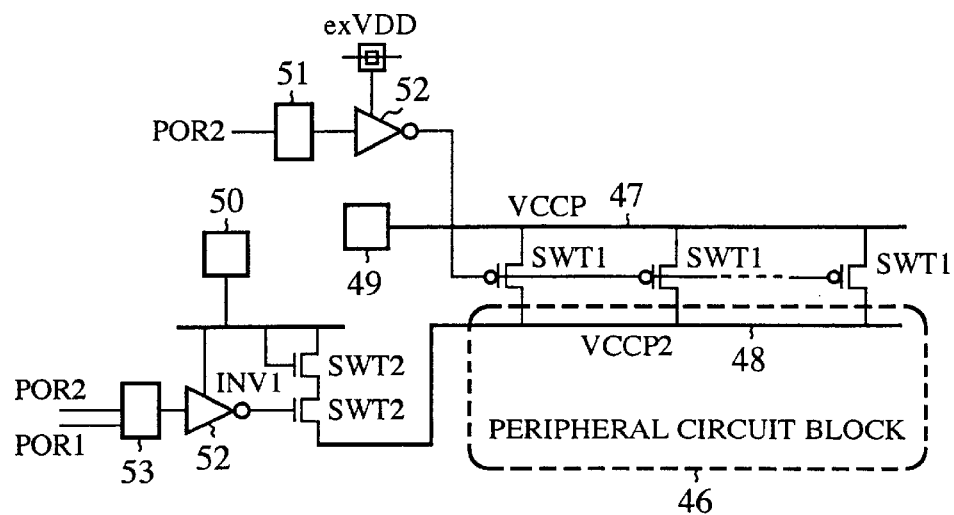
FIG. 11 is a schematic circuit diagram showing the structure of power supply hierarchy for peripheral circuits in a semiconductor integrated circuit according to a fifth embodiment of the present invention.

A semiconductor integrated circuit according to a fifth embodiment of the present invention is so constructed as to precharge a sub-power source line 48 until a second power-on reset signal POR2 rises after a first power-on reset signal POR1 has risen. FIG. 11 is a schematic circuit diagram showing the hierarchical structure of a power supply for peripheral circuits of the semiconductor integrated circuit according to the fifth embodiment of the present invention. In the figure, the same reference numerals as shown in FIG. 9 designate the same components as of the above-mentioned fourth embodiment, and the description of those components will be omitted hereafter. In FIG. 11, reference numeral 53 denotes a precharge control circuit that turns on a switch transistor SWT2 connected to the sub-power source line 48 when the first power-on reset signal POR1 rises, and turns off the switch transistor SWT2 when the power-on reset signal POR2 rises after that.

Figure 12:
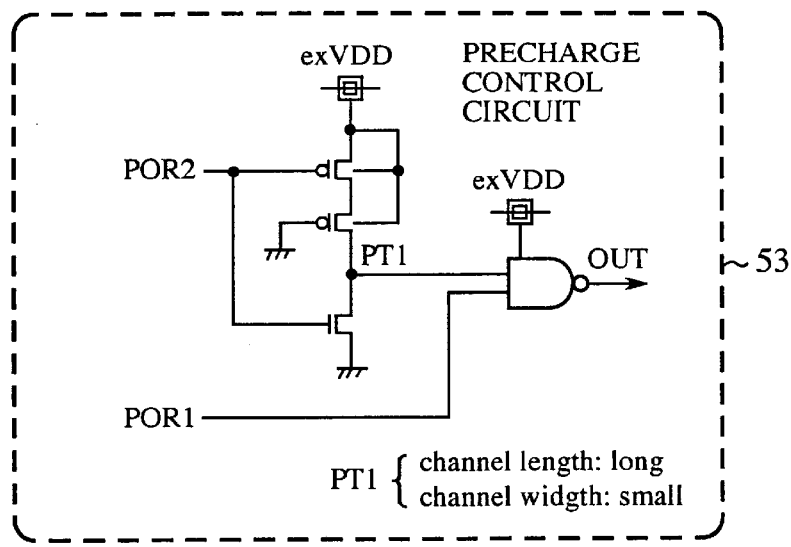
FIG. 12 is a schematic circuit diagram showing the structure of a precharge control circuit disposed in the power supply hierarchy according to the fifth embodiment shown in FIG. 11.

FIG. 12 is a block diagram showing the structure of the precharge control circuit 53. The precharge control circuit 53 has a NAND gate that operates from a power supply exVDD instead of the inverter which is located in the level shifter 51 shown in FIG. 10. The NAND gate implements the logical NAND operation on a signal corresponding to a signal input to the inverter of the level shifter 51 of FIG. 10 and the first power-on reset signal POR1. The output of the NAND gate is sent to the switch transistor SWT2 connected to the sub-power source line 48 by way of an inverter 52, and controls the ON/OFF operation of the switch transistor SWT2.

Figure 13:
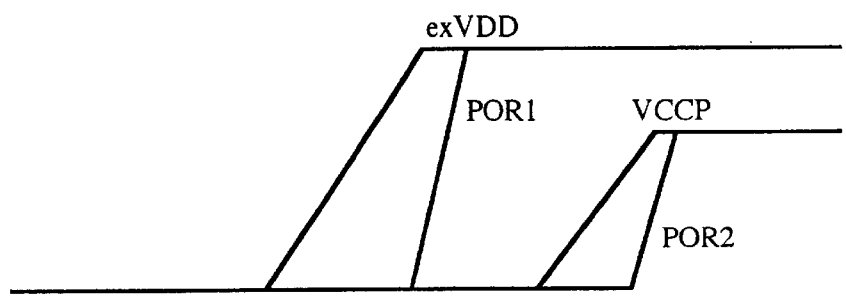
FIG. 13 is an explanatory drawing for showing a relationship with respect to time between a power supply voltage exVDD and a first power-on reset signal, and a relationship with respect to time between another power supply voltage VCCP and a second power-on reset signal, according to the fifth embodiment.
Figure 14:
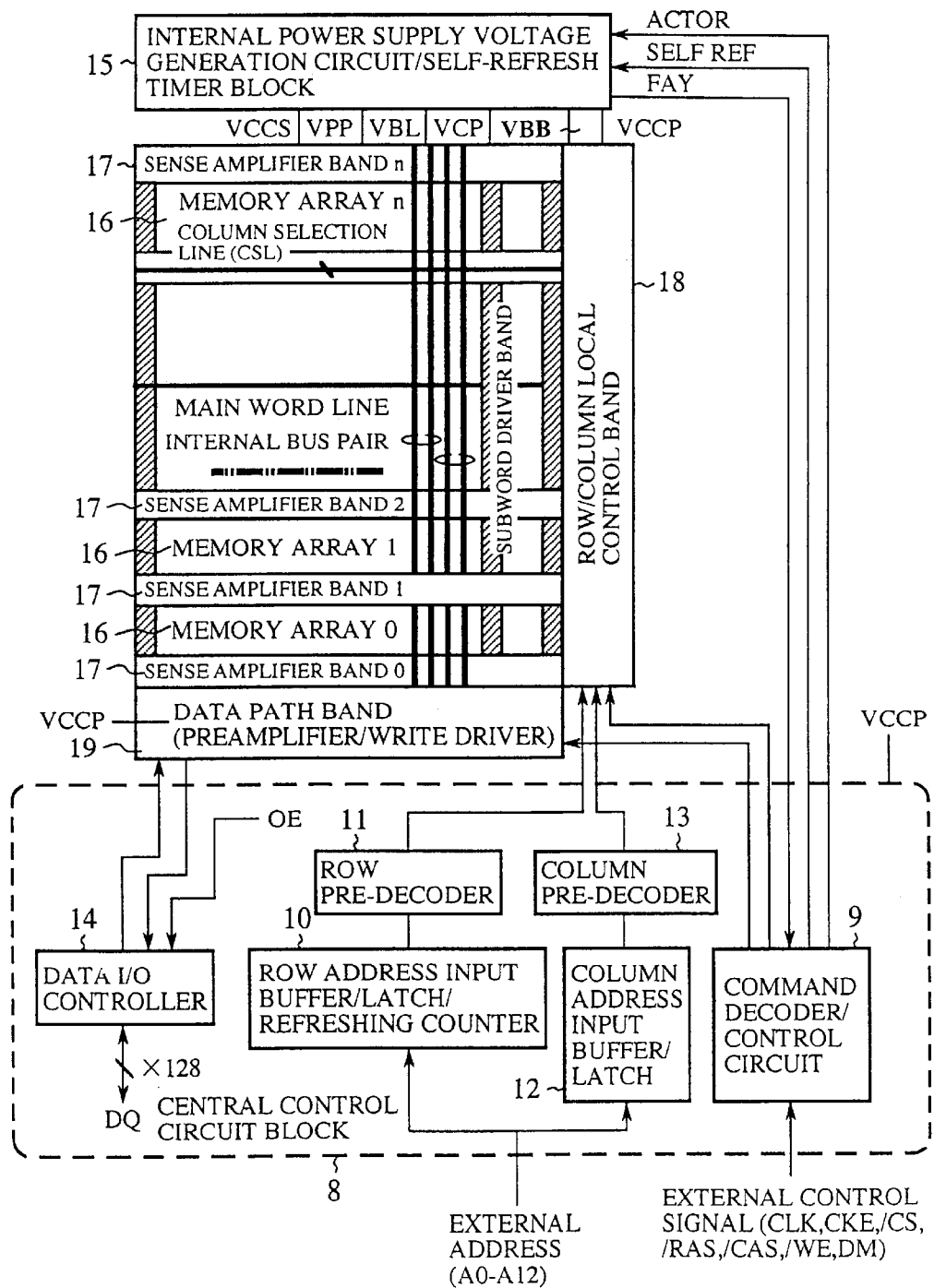
FIG. 14 is a block diagram showing the structure of a DRAM merged with a logic in a prior art semiconductor integrated circuit.

FIG. 13 is an explanatory drawing for showing a relationship with respect to time among the power supply voltage exVDD, a power supply voltage VCCP, the first power-on reset signal POR1, and the second power-on reset signal POR2. The first power-on reset signal POR1 rises in response to the rising of the power supply voltage exVDD, and the second power-on reset signal POR2 rises in response to the rising of the power supply voltage VCCP, as shown in FIG. 13.

The switch transistor SWT2 connected to the sub-power source line 48 switches to the ON state in response to a signal sent from the precharge control circuit 53 by way of the inverter 52 until the second power-on reset signal POR2 rises in response to the rising of the power supply voltage VCCP after the first power-on reset signal POR1 has risen in response to the rising of the power supply voltage exVDD. As a result, the power supply exVDD input to a power supply pad 50 is connected with the sub-power source line 48, and the sub-power source line 48 is precharged up to a proper voltage level. After that, the above-mentioned switch transistor SWT2 connected to the sub-power source line 48 becomes the OFF state and the power supply exVDD is disconnected from the sub-power source line 48 when the second power-on reset signal POR2 rises in response to the rising of the power supply voltage VCCP. The hierarchical configuration of the power supply for the peripheral circuit block according to the fifth embodiment operates like the one according to the above-mentioned fourth embodiment, except for the above-mentioned operation.

As mentioned above, according to the fifth embodiment, the power supply exVDD is applied to the peripheral circuit block and the internal power supply voltage rises after the first power-on reset signal POR1 has risen. Accordingly, the fifth embodiment offers an advantage of being able to precharge the sub-power source line 48 more effectively.

The present invention is not limited to the DRAM and is applied to another memory, such as a flash memory, that uses two or more internal power supply voltages. The present invention can be applied to any memory integrated together with a logic on the same semiconductor substrate.

Many widely different embodiments of the present invention may be constructed without departing from the spirit and scope of the present invention. It should be understood that the present invention is not limited to the specific embodiments described in the specification, except as defined in the appended claims.

What is claimed is:

1. A semiconductor integrated circuit including a logic, a memory coupled to said logic, and a voltage generation means for generating two or more internal power supply voltages based on two or more external power supply voltages supplied from outside said voltage generation means with different timings and for furnishing the plurality of internal power supply voltages to said memory, said voltage generation means comprising:

a standby means with a small current-feed ability that is always activated, for generating said plurality of internal power supply voltages;

an active means with a large current-feed ability that is activated as needed, for generating said plurality of internal power supply voltages; and an activation control means for preventing said active means from being activated until all of the plurality of external power supply voltages rise.

2. The semiconductor integrated circuit according to claim 1, wherein said activation control means is an activation signal control circuit for outputting an activation signal to activate said active means after all of the plurality of external power supply voltages rise.

3. The semiconductor integrated circuit according to claim 2, wherein said activation control means includes a level shifter provided with either a pull-up transistor or a pull-down transistor, for converting a level of the activation signal to activate said active means.

4. The semiconductor integrated circuit according to claim 2, wherein said activation control means includes a level shifter provided with a substrate bias control circuit for throwing said level shifter out of balance, for converting a level of the activation signal to activate said active means.

5. The semiconductor integrated circuit according to claim 1, wherein said activation control means is an activation signal control circuit for outputting an activation signal to activate said active means in response to a power-on reset signal generated after all of the plurality of external power supply voltages rise.

6. The semiconductor integrated circuit according to claim 5, wherein said activation control means includes a level shifter provided with either a pull-up transistor or a pull-down transistor, for converting a level of the activation signal to activate said active means.

7. The semiconductor integrated circuit according to claim 5, wherein said activation control means includes a level shifter provided with a substrate bias control circuit for throwing said level shifter out of balance, for converting a level of the activation signal to activate said active means.

8. A semiconductor integrated circuit including a logic, a memory coupled to said logic, and a voltage generation means for generating two or more internal power supply voltages based on two external power supply voltages supplied from outside said voltage generation means with different timings and for furnishing the plurality of internal power supply voltages to said memory, said circuit comprising: a main power source line to which one of the two external power supply voltages which rises later is applied; a sub-power source line for supplying said external power supply voltage which rises later to a peripheral circuit block; and a precharge means for disconnecting said sub-power source line from said main power source line until a power-on reset signal is generated in response to a rising of the external power supply voltage which rises later, and for charging said sub-power source line up to a fixed level.

9. The semiconductor integrated circuit according to claim 8, wherein said precharge means precharges said sub-power source line up to the fixed level until said power-on reset signal is generated in response to the rising of the external power supply voltage which rises later after another power-on reset signal is generated in response to a rising of the other one of the two external power supply voltages which rises previously.

* * * * *